United States Patent
Downes et al.

(10) Patent No.: US 7,416,106 B1
(45) Date of Patent: *Aug. 26, 2008

(54) TECHNIQUES FOR CREATING OPTIMIZED PAD GEOMETRIES FOR SOLDERING

(75) Inventors: Stuart D. Downes, Milford, MA (US); Jin Liang, Southborough, MA (US); Larry Norris, Quincy, MA (US)

(73) Assignee: EMC Corporation, Hopkinton, MA (US)

( * ) Notice: Subject to any disclaimer, the term of this patent is extended or adjusted under 35 U.S.C. 154(b) by 583 days.

This patent is subject to a terminal disclaimer.

(21) Appl. No.: 10/674,080

(22) Filed: Sep. 29, 2003

(51) Int. Cl.
*B23K 31/02* (2006.01)
(52) U.S. Cl. ................. 228/180.21; 228/215; 228/248.1
(58) Field of Classification Search ........................ None
See application file for complete search history.

(56) References Cited

U.S. PATENT DOCUMENTS

| | | | | |
|---|---|---|---|---|
| 5,675,889 | A * | 10/1997 | Acocella et al. | 29/830 |
| 5,706,178 | A * | 1/1998 | Barrow | 361/777 |
| 5,829,124 | A * | 11/1998 | Kresge et al. | 29/840 |
| 5,859,474 | A * | 1/1999 | Dordi | 257/737 |
| 6,251,766 | B1 * | 6/2001 | Desai et al. | 438/614 |
| 6,324,754 | B1 * | 12/2001 | DiStefano et al. | 29/840 |
| 6,386,435 | B1 | 5/2002 | Downes | 228/248.1 |
| 6,389,691 | B1 * | 5/2002 | Rinne et al. | 29/843 |
| 6,511,347 | B2 * | 1/2003 | Chapman et al. | 439/571 |
| 6,569,248 | B1 * | 5/2003 | Hertz | 118/504 |
| 6,622,905 | B2 * | 9/2003 | Shier et al. | 228/180.22 |
| 6,637,641 | B1 | 10/2003 | Downes et al. | 228/102 |
| 6,720,665 | B2 * | 4/2004 | Garrity et al. | 257/786 |
| 6,734,557 | B2 * | 5/2004 | Taniguchi et al. | 257/738 |
| 7,045,902 | B2 * | 5/2006 | Liu | 257/780 |
| 7,064,435 | B2 * | 6/2006 | Chung et al. | 257/738 |
| 7,084,353 | B1 * | 8/2006 | Downes | 174/261 |
| 7,224,073 | B2 * | 5/2007 | Kim | 257/779 |
| 7,271,484 | B2 * | 9/2007 | Reiss et al. | 257/738 |
| 2001/0011676 | A1 * | 8/2001 | Regner et al. | 228/248.1 |
| 2002/0001936 | A1 * | 1/2002 | Terauchi et al. | 438/618 |
| 2002/0104874 | A1 * | 8/2002 | Byun et al. | 228/180.22 |
| 2003/0060062 | A1 * | 3/2003 | Honda et al. | 439/67 |
| 2004/0195687 | A1 * | 10/2004 | Inoue et al. | 257/738 |
| 2005/0051604 | A1 * | 3/2005 | Claver et al. | 228/180.22 |

OTHER PUBLICATIONS

Stuart D. Downes; U.S. Appl. No. 10/316,286; "Techniques for Mounting a Circuit Board Component to a Circuit Board"; filed Dec. 11, 2002.

Stuart D. Downes. et al.; U.S. Appl. No. 10/607,400; "Circuit Board Processing Techniques Using Solder Fusing"; filed Jun. 26, 2003.

* cited by examiner

*Primary Examiner*—Kiley Stoner
(74) *Attorney, Agent, or Firm*—BainwoodHuang

(57) ABSTRACT

A technique for processing a circuit board involves placing a mask layer on the circuit board, where the mask layer defines a set of pad profiles for a component mounting location. Each pad profile has a set of rounded corners. The technique further involves forming, for each pad profile, a soldering pad having a set of radii corresponding to the set of rounded corners of that pad profile to create a set of soldering pads for the component mounting location. Each soldering pad is configured for a high bond strength solder joint. The technique further involves removing the mask layer from the circuit board and soldering a component to the component mounting location. This technique is well-suited for robustly mounting the component to the circuit board at solder joints with relatively high solder joint bond strengths.

20 Claims, 9 Drawing Sheets

TECHNIQUES FOR CREATING OPTIMIZED PAD GEOMETRIES FOR SOLDERING

BACKGROUND

A circuit board manufacturing process typically involves creating a bare printed circuit board or PCB (i.e., circuit board fabrication), and subsequently populating that circuit board with components (i.e., circuit board assembly). Prior to surface mount technology (SMT), circuit board manufacturers made circuit boards predominantly using pin-in-hole technology. To populate a circuit board using pin-in-hole technology, a manufacturer typically solders components having wire-leads to the circuit board using a wave soldering process. In particular, the manufacturer inserts wire-leads of the components through copper vias or plated through holes (PTHs) within the circuit board from a top side of the circuit board. The manufacturer then passes the circuit board horizontally through a solder wave machine that provides a standing wave of molten solder. As the circuit board passes through the wave of molten solder, solder flows into the copper vias thus soldering the wire-leads of the components to the copper vias of the circuit board.

At the advent of surface mount technology (SMT), manufacturers created hybrid circuit boards that supported both SMT devices and pin-in-hole devices for use with solder wave machinery. Such hybrid PCBs include square or rectangular circuit board pads (e.g., Hot Air Solder Level or HASL pads) for SMT devices, and copper vias for wire-leaded devices. To form square or rectangular SMT circuit board pads (hereinafter generally referred to as simply rectangular circuit board pads), the circuit board manufacturer forms the pads using either a copper defined or solder mask defined process. In one version of the copper defined process, the manufacturer disposes a mask layer (i.e., a thin light-sensitive film) over an outer conductive layer (copper clad) of the circuit board. The manufacturer exposes portions of the mask layer to light and develops the mask layer so that what remains of the mask layer is network of masking portions, i.e., masking structures that define traces, pads, etc. In particular, the masking portions define substantially straight sides and crisp, sharp 90 degree angled corners for the rectangular circuit board pads. The manufacturer can perform these steps for the other side of the circuit board as well. The manufacturer then puts the circuit board through an etching bath which etches away unprotected portions of the outer conductive layer leaving conductive material under the network of masking portions. The corners of the rectangular circuit board pads resulting from the etching process may have up to a 3 mil radius due to etching activity at the corners where there is more exposure to the etchant than at the substantially straight sides. The manufacturer then removes the remaining masking portions leaving a clean circuit board which is ready for assembly.

It should be noted that there are many alternate process variations used to manufacture the external copper features of a circuit board. The above-described subtractive version for making copper defined pads is just one variation. One will appreciate that additive circuits may be produced where the described copper features are additively plated up over bare laminate. There are subtractive-additive processes as well, i.e., processes that employ light sensitive film and pattern plating (e.g., developing the film and subsequently plating over initial copper conductive pads and traces) with a metal layer that will protect the copper features during etching. One will appreciate, therefore, that the earlier-described light sensitive film version is provided simply to illustrate just one generic version out of many for creating copper traces and solderable surfaces in this discussion.

In the solder mask defined process, the manufacturer fabricates a hybrid circuit board having rectangular pads with sharp 90 angled corners. Over the fabricated hybrid circuit board, the manufacturer applies a final solder mask layer which also defines rectangular pad apertures with sharp 90 angled corners which mirror the shapes of the pads. This solder mask layer slightly overlaps the copper of the pads (e.g., by several mils) so that the outer shape of the solder joints that eventually form over the pads is essentially determined by the shape of the rectangular pad apertures defined by the solder mask.

To populate a hybrid circuit board having either copper defined or solder mask defined pads using solder wave machinery, the manufacturer glues the surface mount devices to the circuit board such that contacts of the surface mount devices reside directly over the rectangular circuit board pads. Additionally, the manufacturer inserts wire-leads of the wire-lead devices through the copper vias, as explained earlier. The manufacturer then passes the hybrid circuit board through the solder wave machine. As the hybrid circuit board passes through the wave of molten solder, solder clings to both the rectangular circuit board pads and the contacts of the SMT devices, as well as flows into the copper vias. As a result, solder joints form between the rectangular circuit board pads and the contacts of the SMT devices. Solder joints also form between the copper vias of the circuit board and the wire-leads of the wire-lead devices, as described earlier.

Today, many circuit board manufacturers have replaced their solder wave machinery with SMT equipment that utilizes a solder printing process. Here, the manufacturer prints solder paste over the rectangular circuit board pads of the circuit board (e.g., using a stencil), and then positions surface mount components over the rectangular circuit board pads and in contact with the printed solder paste (e.g., using automated pick-and-place equipment). The manufacturer then passes the circuit board through an oven that applies heat to activate flux and to melt solder within the solder paste. As a result, the flux strips the pad surfaces of oxidation and the solder liquefies and wets to the pad surfaces to form solder joints between the rectangular circuit board pads and the contacts of the SMT devices.

Some manufacturers have made enhancements to their SMT printed solder processes. For example, some manufacturers provide round or hexagonal circuit board pads rather than square or rectangular circuit board pads for certain SMT devices (e.g., for Ball Grid Array components having a high density of contacts). As another example, some manufacturers provide rectangular-shaped pads with slightly rounded corners for soldering to SMT devices having gull-wing leads. It is believed that these manufacturers provide the rounded corners to these discreet pads because it is easier for these manufacturers to control the etching tolerances of such pads vis-à-vis circuit board pads with sharp 90 degree corners. As yet another example, some manufacturers provide pads having the shape of a semi-circle for discreet components.

SUMMARY

Unfortunately, there are deficiencies to the above-described conventional circuit board processing approaches. In particular, solder volumes and process characteristics for the newer SMT printed solder processes are distinctly different from the earlier-described hybrid circuit board requirements, and there has been a tendency in the industry not to update solder pad geometries for these newer SMT printed solder processes, but rather to continue to work with pre-established solder pad geometries having their heritage based on wave soldering process characteristics, i.e., manufacturers still use rectangular circuit board pads with newer SMT printed solder processes. These rectangular circuit board pads work satisfactorily in wave soldering processes because the pads are exposed to an abundance of solder and the pads are not very close together, thus resulting in robustly formed solder joints with relatively low likelihood of solder shorts. However, as will now be explained in further detail, these rectangular circuit board pads do not work very well for the newer SMT printed solder processes.

For circuit boards using a conventional SMT printed solder process, there tends to be significant movement of the solder during the soldering process which can result in promotion of solder fines or microballs of solder (i.e., tiny particles of solder) scattered in undesired locations between conductive surface structures (e.g., adjacent pads) thus lower the surface insulation resistance (SIR) of the circuit board and increasing the likelihood of unintended current flow between neighboring surface structures. Furthermore, for such SMT circuit boards, the component mounting locations tend to have higher pad densities, i.e., smaller pads which are closer together (finer pitches). Accordingly, such circuit boards are more susceptible to solder fine contamination, and the solder joints formed over such pads tend to have lower amounts of solder and less bonding strength thus making the circuit boards more susceptible to solder joint failures (e.g., fractures due to expansion stresses). As will now be explained in further detail, the conventional wave soldering pad geometries (i.e., rectangular circuit board pads with sharp 90 degree corners) exacerbate the above-described deficiencies.

In the conventional SMT printed solder process, when manufacturers print solder paste over rectangular circuit board pads with crisp 90 degree corners, the manufacturers typically cover the tops of the pads completely with solder paste (100 percent coverage) theorizing that such coverage ensures that flux within the solder paste is distributed over the entire pad surfaces for thorough pad cleaning when the circuit board passes through an oven during soldering.

Unfortunately, there are also a variety of competing forces that cause the solder within the solder paste to move about the pad surfaces when the circuit board passes through the oven during the soldering process. In particular, as the solder paste reduces and the suspended solder melts into liquid form, the viscosity of the solder changes thus causing parts of the solder to torque and twist. Additionally, the solder contracts toward the pad centers due to surface tension. Simultaneously, the remote pad extremities (e.g., the sharp 90 degree pad corners, the surface trace attachment points, etc.), which have been cleaned by the flux and thus have a high wetting rate for solder, attempt to pull the solder from the centers of the pads. These corner extremities tend to (i) provide the longest distances for the molten solder to spread to, as well as (ii) provide 90 degree rectangular sides that impose dragging forces preventing the liquid solder from spreading into the corners due to edge effects. Furthermore, the component contacts and the various portions of the pads tend to heat up at different rates which can cause further the migration and torquing of the solder. The end result is that the rectangular circuit board pads with remote corner extremities and solder paste printed thereon provides for substantial solder movement while the solder is in a highly liquid form, thus resulting in splattering and scattering of solder fines around the rectangular circuit board pads during circuit board assembly, and thus increasing the likelihood of a circuit board failure during operation.

Furthermore, the sharp 90 degree pad corners tend to have minimal amounts of solder. As a result, the intermetallics tend to be weakest at these corner locations, and these extremities are prone to being sources of crack initiations and crack propagation which, in some situations, lead to component lead continuity failure. For example, as the circuit board and soldered components heat up at the beginning of operation, the circuit board and components tend to expand at different rates, and the corner locations of the solder joints tend to be the first points to succumb to stresses resulting from such expansion.

Additionally, cosmetic differences between the corner locations and central areas of each solder joint raise quality control concerns (e.g., red foot) and, in some situations, result in failure of an assembled circuit board to pass inspection. In particular, an inspector working for a circuit board manufacturer may reject or fail an assembled circuit board if the inspector spots a lack of solder in the corner extremities out of concern that, even though the circuit board currently works, it will fail at some point in the future when a solder joint fracture arises due to a weakness in solder joint bonding strength at the point that lacks solder. A failure to pass inspection at this point is one of the most costly kinds of failures due to the high amount of value added in manufacturing the circuit board up to this point.

Furthermore, in the future, there may be a movement toward the use of more environmentally friendly solders that do not contain Lead (Pb). Since lead-free solders (e.g., tin-silver-copper solder) are characterized by significantly reduced wetting rates vis-à-vis lead-based solders (e.g., tin-lead solder), the above-described deficiencies are even more significant if lead-free solders are employed with SMT printed solder processes. In particular, circuit boards that use rectangular pads will be extremely susceptible to solder joint failures due to bond strength weaknesses at the extremities of the lead-free intermetallics.

It should be understood that some circuit boards have SMT pads which do not have extremely crisp 90 degree corners. For example, some circuit boards include rectangular circuit board pads which have slightly rounded corners for soldering to devices having gull-wing leads. It is believed that the manufacturers of such circuit boards choose to provide such pads because they have more control over etching tolerances and pad consistency. The motivation for rounding the pad corners is not to improve solder joint bond strength, and the geometries of these gull-winged circuit board pads are not necessarily optimized in a manner that (i) reduces the promotion of solder fines and/or (ii) improves solder joint bond strength (e.g., these conventional gull-wing circuit board pads do not have enough rounding in the corners to prevent solder fine generation and/or inhibit formation of weak stress points for intermetallic failure). As another example, the earlier-described conventional pads having the shape of a semi-circle suffer from possessing extremely sharp corners (e.g., sharper than 90 degrees) and thus provide pad extremities that promote solder fines and that form weak points in the intermetallics (e.g., due to low solder volume in the extremities).

It should be further understood that there are some other non-rectangular circuit board pads. For example, some conventional circuit boards have round circuit board pads that solder to solder balls of Ball Grid Array (BGA) devices. These round circuit board pads have no straight edges and no corners because these pads define circles. As another example, other conventional circuit boards have octagonal circuit board pads that solder to solder balls of BGA devices in order to obtain higher pad densities than the round circuit board pads, i.e., the pad centers of the octagonal pads can be closer together due to the presence of straight sides between the hexagonal pads. Unfortunately, these pad shapes may not be well-suited for mounting to certain components such as particular individual electronic element packages (i.e., individual resistors, capacitors, diodes, etc.).

At this point, it should be understood that many conventional surface mount solder pad (footprint) shapes employ internal angles of about 90 degrees (i.e., square and rectangular pads). In general, such angles are bounded by two sides (walls). The affinity of solder to these mechanical boundaries reduces the molten solders ability to flow due to modification of the wetting forces. In layman's terms, a molten solder alloy tends to flow more readily when the axis of flow is unimpeded by a mechanical restriction, when the axis of flow intersects a surface that is at least 45 degrees to the axis of flow, and when the flow intersects a surface that has a radius that mimics the 45 degree condition and accelerates the angle of clearance or flow.

In accordance with certain embodiments of the present invention, a small radius of as little as 8 mils to 12 mils can be used to modify an internal or external near 90-degree footprint feature to promote solder flow and wetting. Such footprints fall primarily into two categories: (i) keeping a square or rectangular design shape and overall dimensions of the hybrid reflow pads while optimizing or radiussing the internal angles, and (ii) taking the dimensions and features of a trapezoidal/hexagonal design and optimizing its features by fitting 8 mil to 12 mil radii (or greater) to its corner angles.

A trapezoidal design for circuit board pads (e.g., a hexagonal pad formed by combining multiple trapezoid shapes), which is similar to that described above, is described in U.S. patent application Ser. No. 10/316,286, entitled "Techniques for Mounting a Circuit Board Component to a Circuit Board", the teachings of which are hereby incorporated by reference in their entirety. From some perspectives, certain embodiments of the present invention may be viewed as being improvements to the techniques disclosed in this patent application.

Embodiments of the invention are directed to techniques for creating optimized pad geometries for a circuit board which involve configuring the circuit board with soldering pads having rounded corners. Such techniques are applicable to all solder alloys and flux systems (e.g., lead-based soldering systems, lead-free soldering systems, etc.) and enable the manufacture to provide optimized solderable surface geometries with maximized solder flow and wetting. In particular, soldering pads having such geometries tend to form strong and reliable solder joints. Furthermore, such soldering pads reduce the likelihood of forming non-wetting pad extremities, thus eliminating sources of crack initiations and propagation. Moreover, these techniques are applicable to both copper defined pad technologies and solder mask defined pad technologies.

One embodiment of the invention is directed to a technique for processing a circuit board which involves placing a mask layer on the circuit board, where the mask layer defines pad profiles for a component mounting location. Each pad profile has rounded corners (e.g., radii in a range between 8 to 12 mils, radii greater than 8 mils, etc.). The technique further involves forming, for each pad profile, a soldering pad having radii corresponding to the rounded corners of that pad profile to create soldering pads for the component mounting location (e.g., radii greater than 8 mils) thus configuring the solder pads for high bond strength solder joints. The technique further involves removing the mask layer from the circuit board and soldering a component to the component mounting location (e.g., using a solder paste printing process that provides less than 100 percent coverage). This technique is well-suited for robustly forming solder joints with relatively high solder joint bond strengths and with low scattering of solder fines thus improving quality and reliability of the circuit board.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for creating optimized pad geometries for a circuit board which involve configuring the circuit board with soldering pads having rounded corners. Such techniques are applicable to any solder alloy and any flux system (e.g., a lead-based solder system, a lead-free solder system, etc.) and enable the manufacture to provide optimized solderable surface geometries with maximized solder flow and wetting. In particular, soldering pads having such geometries tend to form strong and reliable solder joints. Additionally, such soldering pads reduce the likelihood of forming weak points in the intermetallics at non-wetting pad extremities, thus reducing high stress solder joint inclusions derived from poor wetting.

Many manufacturers make circuit boards having rectangular circuit board pads for use with SMT printed solder processes. These pads have straight edges and crisp 90 degree angled corners. Some manufactures make circuit boards with other pad shapes having straight edges and sharp corners (e.g., hexagons, trapezoids, etc.) for use with SMT printed solder processes. For example, a trapezoid design for circuit board pads is described in U.S. patent application Ser. No. 10/316,286, entitled "Techniques for Mounting a Circuit Board Component to a Circuit Board", the teachings of which are hereby incorporated by reference in their entirety. Certain embodiments of the present invention can be viewed as enhancements to this United States patent application because these embodiments are directed to a set of rules for rounding and blending intersections between substantially straight edges to promote little solder flow thus leaving healthy amounts of solder to form strong solder bonds. That is, curved portions of pads (e.g., intersections between substantially straight edges of the pads) should have at least an 8 mil radius that reduces or eliminates outer-reaching pad extremities and decreases the edge effects. Accordingly, the manufacturer provides a etching mask layer that defines pad profiles having rounded corners and blended edges with at least 8 mil radii.

Figure 1:
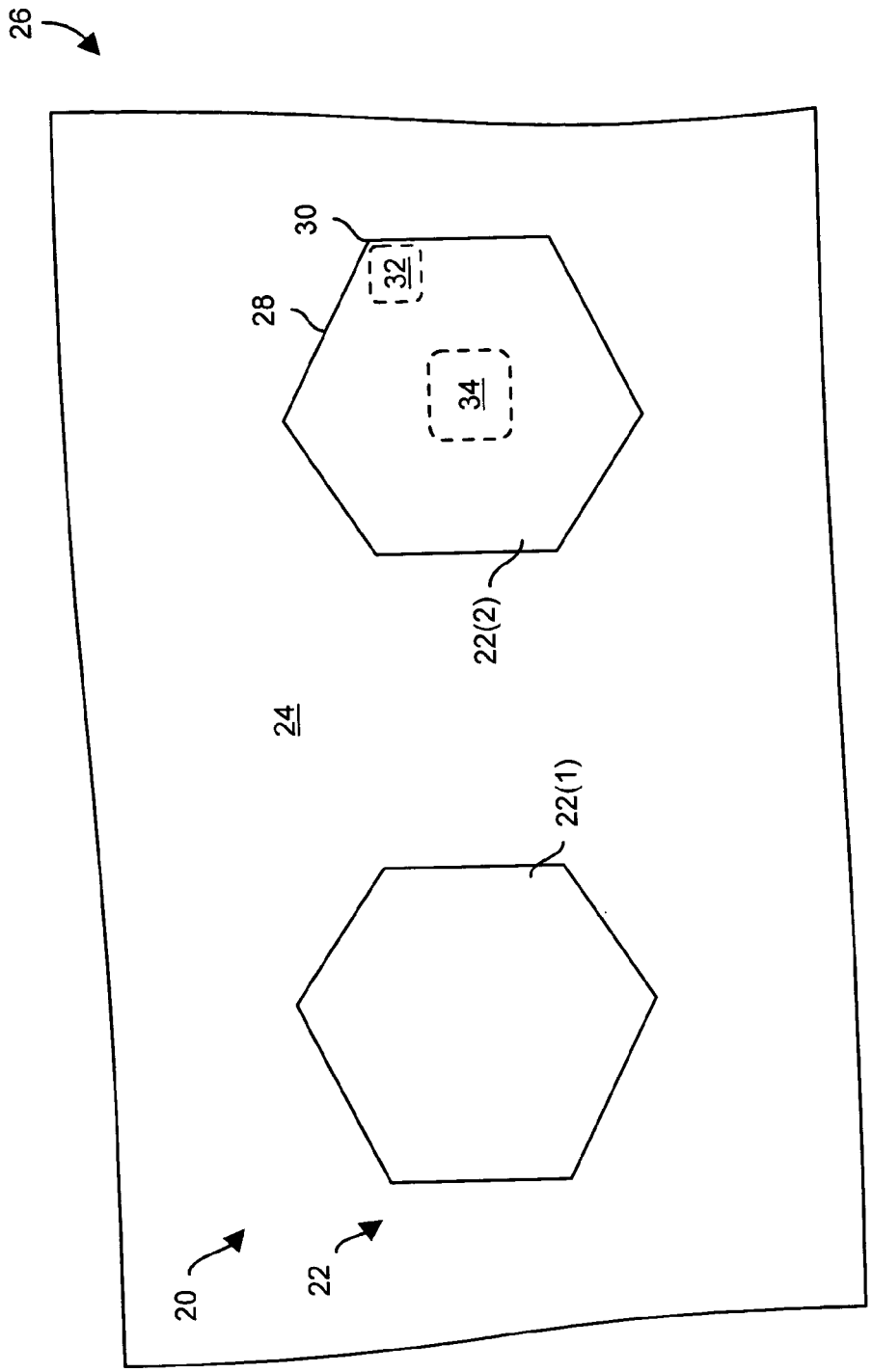
FIG. 1 shows a top view of a conventional pad layout for a common circuit board device.

FIG. 1 shows, for comparison purposes, a top view of a conventional component mounting location 20 for a common circuit board component (e.g., a 0402 packaged device). This component mounting location 20 is similar to those disclosed in U.S. patent application Ser. No. 10/316,286. In particular, the component mounting location 20 includes two SMT circuit board pads 22(1), 22(2) (collectively, SMT circuit board pads 22) which reside on the surface 24 of a circuit board 26. By way of example only, the SMT circuit board pads 22 are configured to solder to an SMT device having two corresponding contacts (e.g., a diode, a resistor, a capacitor, etc.).

As shown in FIG. 1, the SMT circuit board pads 22 have substantially straight edges 28 and sharp corners 30 resulting in pad extremities 32 which are rather distant from the central portions 34 of the pads 22, and the SMT circuit board pads 22 have angles which are greater than 90 degrees. These extremities can be somewhat susceptible to low solder amounts and be weak points in solder bond strength. In the context of rectangular circuit board pads, it should be understood that the distances to the corner extremities are even greater, and that such pads have 90 degree corners which are even more susceptible to low solder amounts and weak solder bond strength. In particular, although such corners may be slightly rounded due to the etching process (e.g., such a corners may have a subtle 3 mil radius), such rounding is relatively insignificant in improving solder flow and promoting high bond strength. Rather, the sharper corner of a conventional rectangular circuit board pad leaves a significant pad extremity which will likely bond with only a small amount of solder and thus provide a source of crack initiation and crack propagation.

To reduce or eliminate these sources of crack initiation and propagation, certain embodiments of the invention impose rules for rounding and blending the intersection between straight edges of a pad (e.g., see the corners 30 between straight edges 28 of the pads 22 in FIG. 1). For example, to form a corner of a pad, the manufacturer provides a solder mask layer that defines pad profiles with well-rounded corners. In one arrangement, the protective etching mask defines pad profiles having corner radii between 8 mils and 12 mils. Such rounding of the otherwise sharper and crisper corners of the pad profile results in an SMT circuit board pad with corner radii of at least 8 mils after etching. Accordingly, the manufacturer is capable of purposefully creating circuit boards having pads with enhanced rounded corners (e.g., pads with corner radii that are greater than 8 mils) to eliminate poorly wetting pad extremities (e.g., see the extremity 32 in FIG. 1 which is more prone to poor wetting and solder joint formation with a low solder amount) and thus form robust and reliable solder joints.

Figure 2:
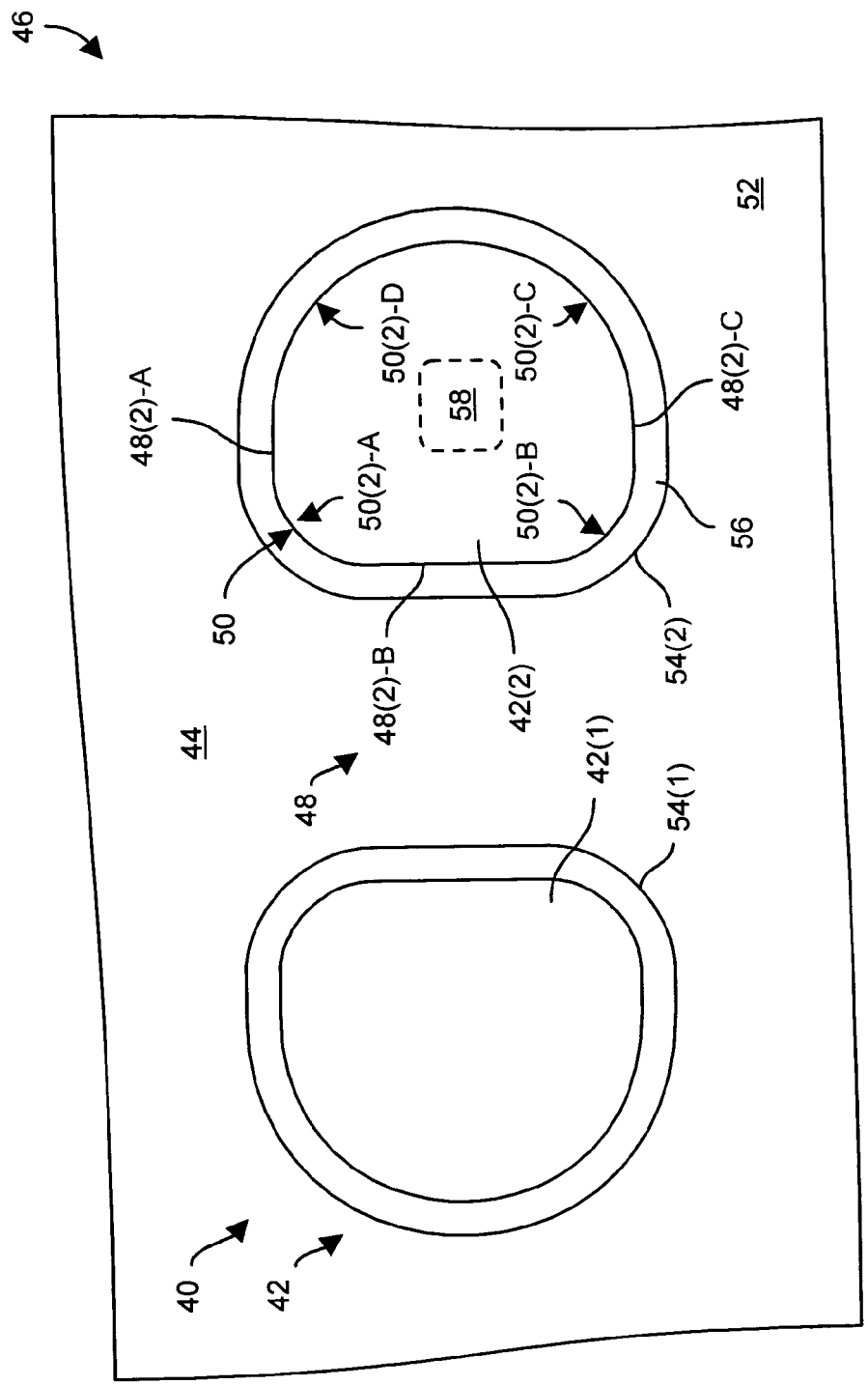
FIG. 2 shows a top view of a copper defined pad layout for the common circuit board device in accordance with an embodiment of the invention.

FIG. 2 shows a top view of a component mounting location 40 for a common circuit board component (e.g., an 0402 package, an 0603 package, etc.) in accordance with an embodiment of the invention. Connecting traces and the SMT component have been purposefully omitted to simply FIG. 2. As shown, the component mounting location 40 includes two SMT copper defined circuit board pads 42(1), 42(2) (collectively, SMT copper defined circuit board pads 42) which reside on a surface 44 of a circuit board 46. The SMT circuit board pads 42 have few or no sharp corners (e.g., the pads 42 have somewhat of a kidney bean shape), and are configured to solder to a common circuit board component (e.g., a diode, a resistor, a capacitor, etc.) using an SMT printed solder process. As will be explained in further detail later, the lack of sharp corners means that there are no pad extremities to (i) draw or pull solder during the soldering process that would otherwise result in significant solder movement to promote solder fines, and (ii) form weak points in the intermetallics due to low solder amounts.

As shown in FIG. 2, each SMT circuit board pad 42 has at least one straight edge 48 and at least two rounded corners 50. By way of example, each pad 42 has two rounded corners 50(2)-A, 50(2)-B with 8 mil radii and two opposite rounded corners 50(2)-C, 50(2)-D with 17 mil radii. The rounded corners 50(2)-C, 50(2)-D are blended together such that they essentially form a single curve having a 17 mil radius. The rounded corner 50(2)-A separates the straight edges 48(2)-A and 48(2)-B. Similarly, the rounded corner 50(2)-B separates the straight edges 48(2)-B and 48(2)-C. Furthermore, the rounded corners 50(2)-C, 50(2)-D separate the straight edges 48(2)-A and 48(2)-C.

As further shown in FIG. 2, the circuit board 46 further includes a solder mask 52 that defines soldering apertures 54(1), 54(2) that mirror the pads 42. By way of example only, the soldering apertures 54(1), 54(2) provide a 3 mil clearance 56 around the pads 42. Accordingly, the soldering apertures 54(1), 54(2) define radii which are larger than the radii of the pads 42.

It should be understood that, in contrast to substantially round conventional pads (i.e., circular pads for BGA devices which do not have any straight edges), each of the copper defined pads 42 has at least one substantially straight edge 48 and is well-suited for soldering to non-BGA type devices. For example, the pads 42 of FIG. 2 are well-suited for discreet 0402 or 0603 packaged components, and the like. That is, the shape of the pads 42 is preferably based, at least in part, on the dimensions of the circuit board component to provide certain self-aligning features for the components in a manner similar to that provided by pads of the above-mentioned U.S. patent application Ser. No. 10/316,286. Additionally, the peripheries of pads 42 (i.e., the rounded corners and straight edges) are close to the central regions 58 making the pads 42 essentially free of extremities that would otherwise be susceptible to low solder amounts and weak solder bond strength. Accordingly, the pads 42 do not operate as a source of solder fines, or a source of crack initiation and propagation as do conventional rectangular pads with sharp corners between straight edges.

Figure 3:
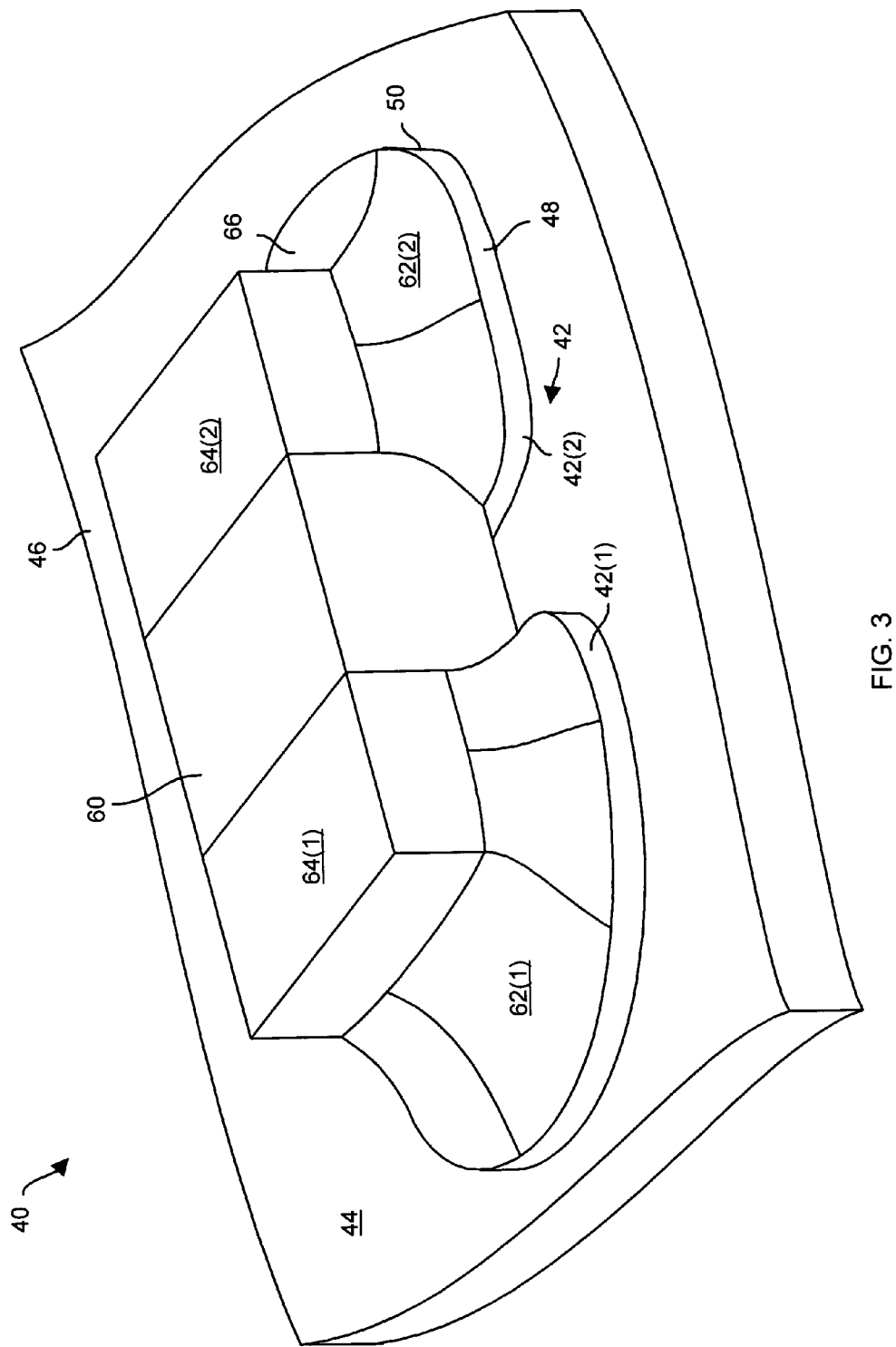
FIG. 3 shows a perspective view of the common circuit board device soldered to the copper defined pad layout of FIG. 2.

FIG. 3 shows a perspective view of a common circuit board device 60 soldered to the component mounting location 40. The solder mask 52 is omitted from FIG. 3 for simplicity. As shown in FIG. 3, solder joints 62(1), 62(2) (collectively, solder joints 62) robustly connect the component contacts 64(1), 64(2) of the circuit board device 60 to the respective surface mount circuit board pads 42(1), 42(2). Due to the existence of the rounded corners 50 of the copper defined pads 42, there are no extremities as in conventional rectangular circuit board pads that produce weak intermetallics which promote solder joint fractures. Moreover, the lack of such extremities in the pads 42 reduces the occurrences of conventional cosmetic solder defects, especially non-wetting of solder pad corners (e.g., red foot which is a PCB finish artifact), where conventional solder pads are utilized by design.

As shown in FIG. 3, each solder joint 62 includes healthy and well-formed fillets 66 for high bond strength since no solder-lacking extremities exist. In particular, each solder joint 62 has a substantially high and consistent aspect ratio around the pad periphery (e.g., there are little or no striations in the solder joints 62). Accordingly, as the circuit board device 60 and the circuit board 46 expand at different rates during operation (e.g., after initial power up), there is adequate solder volume and elasticity so that stresses between the device 60 and the circuit board 46 are more evenly distributed across the solder joints 62 will little or no possibility of cracking. Further details of the invention will now be provided with reference to FIG. 4.

Figure 4:
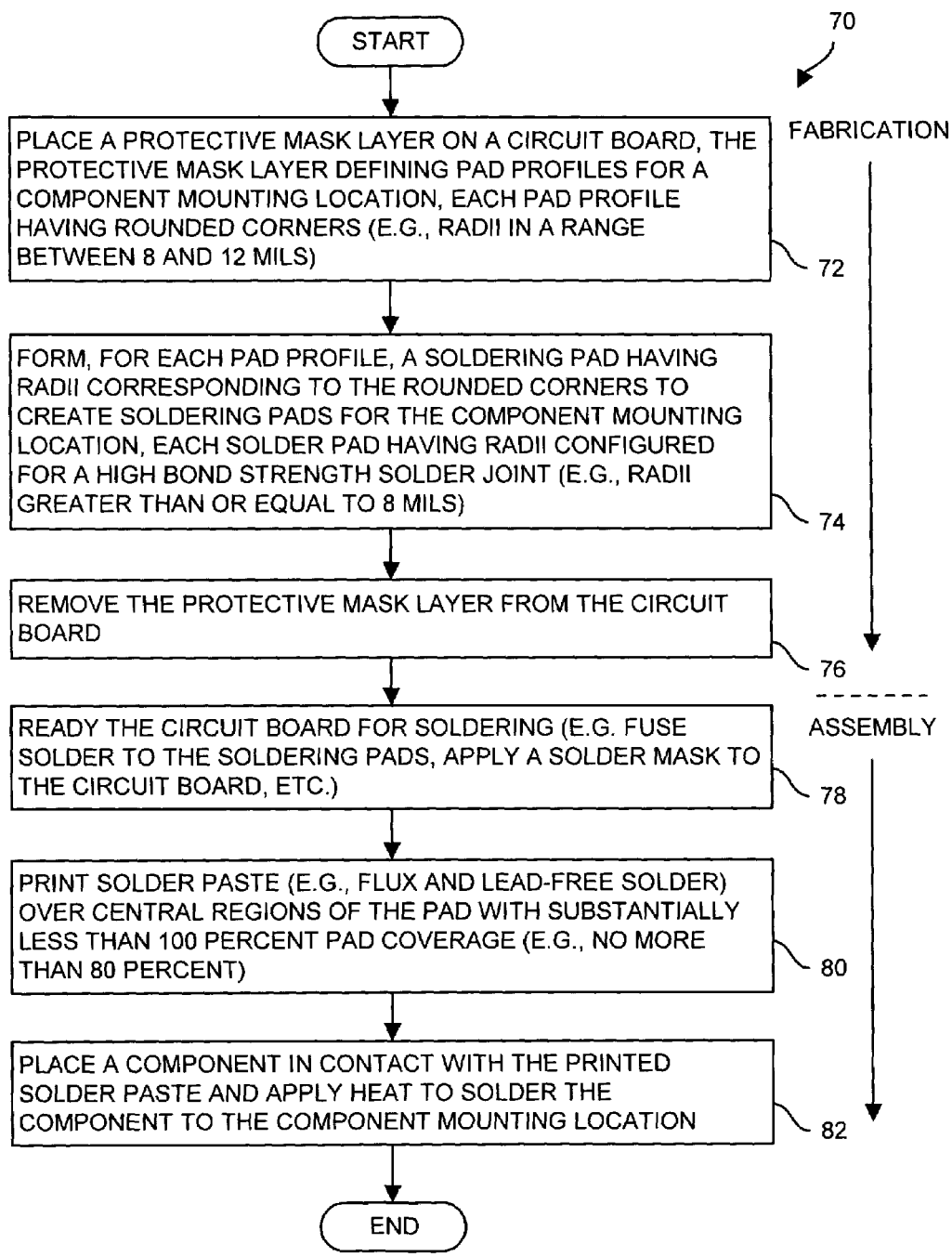
FIG. 4 shows a flowchart of a procedure for copper defined pads in accordance with an embodiment of the invention.

FIG. 4 shows a procedure 70 which is performed by a manufacturer when processing a circuit board in accordance with an embodiment of the invention. Such a procedure enables the manufacturer to optimize copper defined solderable surface geometries of the circuit board thus maximizing solder flow and wetting. Prior to step 72, the manufacturer has formed all but the outer conductive structures of the circuit board. For example, in the context of multi-layered circuit boards, the manufacture has combined the various layers together, and drilled holes through the layers. Additionally, an industry standard layer of copper (drilled copper clad) exists on the outer surface of the circuit board so that the circuit board is ready for patterning and etching.

In step 72, the manufacturer places a protective etching mask layer (e.g., a photo-imageable film) on the circuit board. The protective etching mask layer defines pad profiles for a component mounting location. Each pad profile has rounded corners (e.g., radii in a range between 8 and 12 mils). It should be understood that step 72 is relatively straight forward and may simply involve the application of a uniform layer of photosensitive film, exposing portions of the uniform layer to light, and then developing the layer to form the above-described etching mask layer which defines pad profiles with rounded corners. In contrast to conventional mask layers which define pad profiles with sharp corners, the rounded corners of the mask layer in step 72 eventually translate into SMT circuit board pads with well-rounded corners with enhanced wetting characteristics.

In step 74, the manufacturer forms, for each pad profile, a copper defined soldering pad having radii corresponding to the rounded corners thus creating a set of soldering pads for the component mounting location. In particular, the manufacturer etches away exposed portions of copper on the outer surface of the circuit board thus leaving only the portions of the copper that are protected by the protective etching mask layer, i.e., leaving surface traces, soldering pads, etc. on the outer surface of the circuit board. It should be understood that the copper defined soldering pads have radii which correspond to the rounded corners of the pad profiles defined by the mask layer. That is, the copper defined soldering pads have radii which are now configured for high bond strength solder joints (e.g., radii greater than or equal to 8 mils). Additionally, there are no significant pad extremities that would promote further movement of the solder while it is in its most liquid form (e.g., dragging forces at the extremities), and thus there is a reduced likelihood of splattering and forming undesirable solder fines during soldering.

In step 76, the manufacturer removes the remaining portions of the protective mask layer from the circuit board. At this point, the soldering pads are well-formed and have geometries which are conducive for forming robust solder joints with little or no weak points that would otherwise be susceptible to crack formation and propagation.

In step 78, the manufacturer readies the circuit board for assembly (e.g., silk screens markings onto the circuit board, applies solder to the pads, etc.). In one arrangement, the manufacturer provides a solder mask over the portions of the circuit board which are not designated for soldering and fuses a thin layer of solder to the soldering pads. Such solder fusing improves the wetting rate of the soldering pads for enhanced solder joint bond strength. A similar solder fusing technique which is suitable for use by embodiments of the present invention is disclosed in U.S. patent application Ser. No. 10/607,400, entitled "Circuit Board Processing Techniques Using Solder Fusing", the teachings of which are hereby incorporated by reference in their entirety. In an arrangement which uses lead-free solder during circuit board assembly, the manufacturer fuses lead-free solder to the circuit board thus improving the bonding strength of the lead-free solder joints.

In step 80, the manufacturer prints solder paste over the copper defined soldering pads of the circuit board. In some arrangements, the manufacturer prints solder paste over central regions of each pad with substantially less than 100 percent pad coverage (e.g., 50 pad coverage, 80 percent pad coverage, etc.). By leaving the peripheries of the soldering pads exposed, there is better control over the placement of the solder and less opportunity for tiny amounts of solder ("solder fines") to (i) escape beyond the confines of the soldering pads, and (ii) attach to the non-conductive portions of the circuit board (e.g., to the clearances between the pads and the solder mask). Accordingly, there is little or no opportunity to scatter conductive contamination onto undesired locations of the circuit board which otherwise could reduce surface insulation resistance and result in undesired current flow. In one arrangement, the printed solder paste is substantially lead-free, i.e., a combination of flux and lead-free solder.

In step 82, the manufacturer places a circuit board component in contact with the printed solder paste and applies heat to solder the component to the component mounting location. As the solder paste heats up, the flux within the solder paste removes oxidized copper from the copper defined soldering pads. Additionally, the solder within the solder paste becomes liquidus and wets to the exposed metallic surfaces, i.e., the contacts of the circuit board component and the soldering pads. In contrast to conventional solder printing approaches which print solder paste over 100 percent of the pad surfaces, the solder paste printed in step 80, particularly when printed over substantially less than 100 percent of the pad surfaces, does not splash or migrate as much thus reducing or eliminating solder fines and the likelihood of forming an unintended solder short between neighboring metallic structures. Moreover, since there no outreaching extremities (i.e., the pad corners are substantially rounded), there are fewer dragging forces applied to the liquid solder and thus less spreading and thinning out of the solder. Rather, the available solder tends to stay together to form robust fillets with high and consistent aspect ratios for higher solder bond strength (e.g., see the robustly-formed solder joints 62 in FIG. 3).

It should be understood that the procedure 70 is applicable to any solder alloy and flux system (e.g., a lead-based solder system, a lead-free solder system, etc.) and enables the manufacture to provide optimized printed circuit solderable surface geometries in an electrical interconnect system. The procedure 70 maximizes solder flow and wetting. Accordingly, the procedure 70 is particularly well-suited for use with lead-free solders since lead-free solders (which tend to have lower wetting rates than lead-based solders) are more challenged to form strong solder joint bonds between circuit board pads and component contacts. That is, lead-free solders which may not be easily plastically deformed to handle high local stresses benefit significantly from the embodiments of the invention because the radiused footprints increase wettability, spreadibility, and reliability of such lead-free soldering. Further details of the invention will now be provided with reference to FIGS. 5 and 6.

Figure 5:
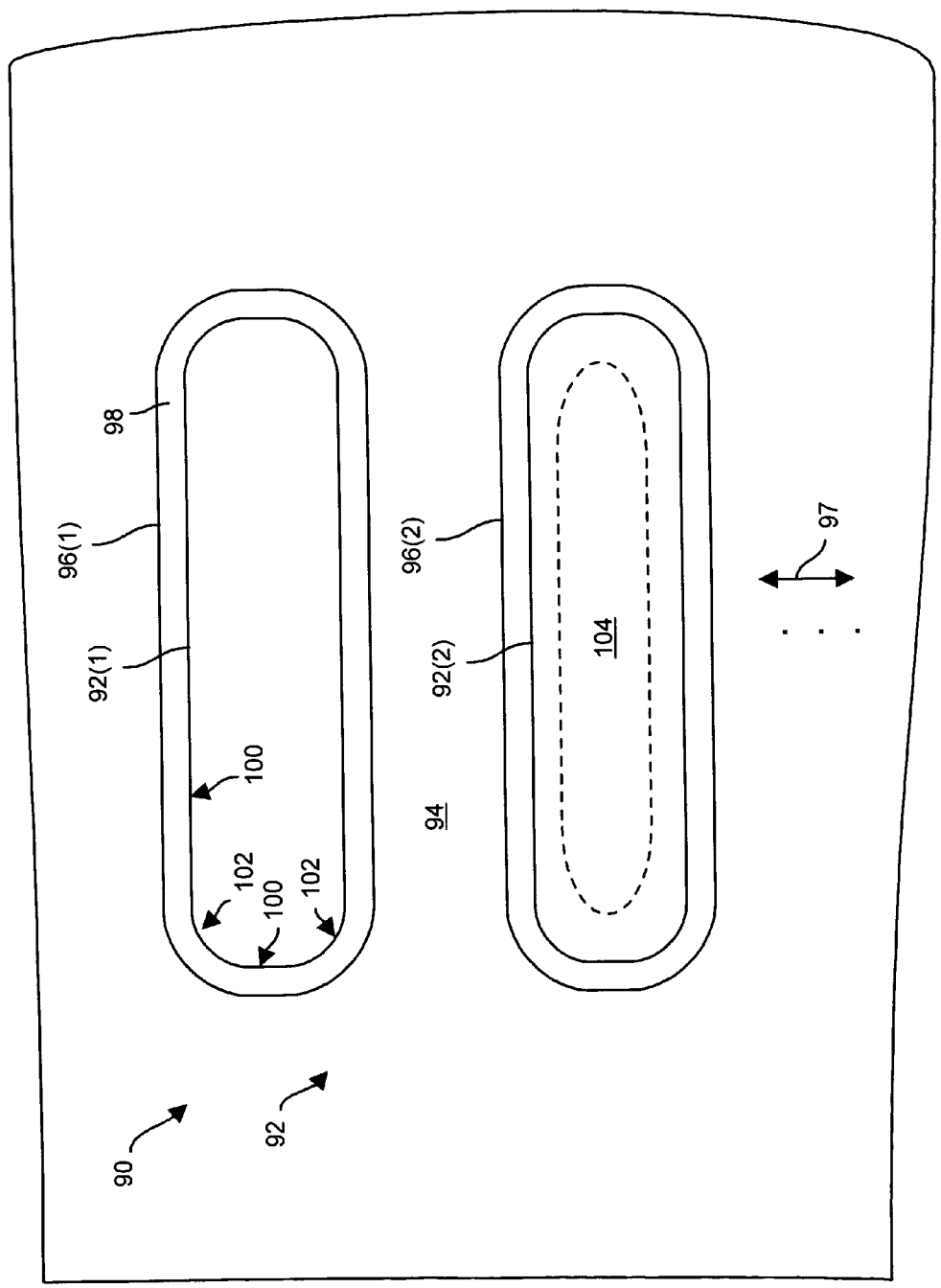
FIG. 5 shows a top view of an alternative copper defined pad layout for a different circuit board device.
Figure 6:
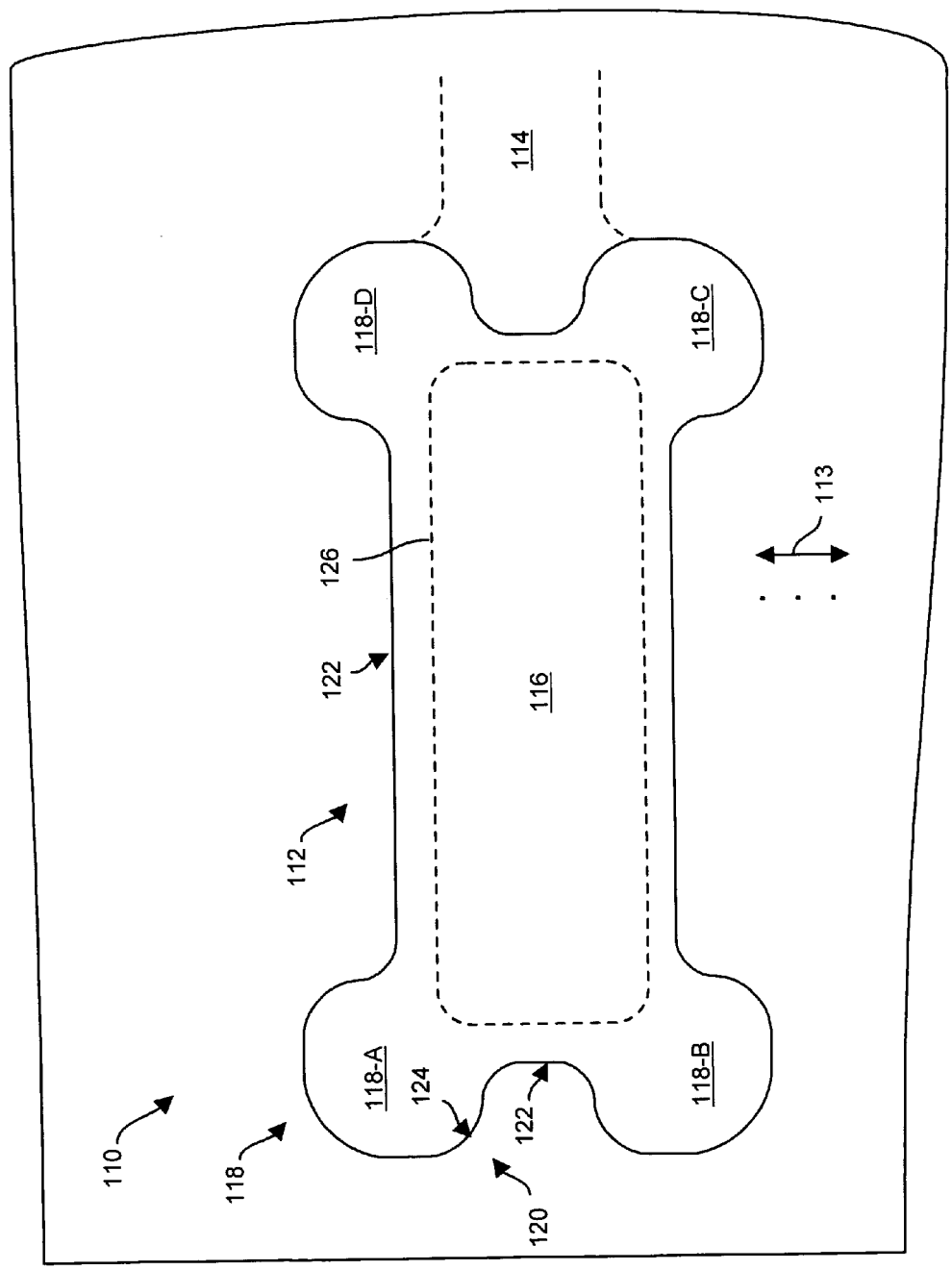
FIG. 6 shows a top view of yet another copper defined pad layout for yet another circuit board device.

FIGS. 5 and 6 show top views of alternative copper defined pad layouts for different soldering situations. Recall, that in accordance with certain embodiments of the invention, the manufacturer applies a set of rules to round and blend intersections between substantially straight edges to promote little solder flow thus leaving healthy amounts of solder to form strong solder bonds. The sharp corner extremities are minimized or eliminated so that there is little or no pulling and dragging of liquidus solder which, in conventional rectangular circuit board pads, increases the likelihood of forming solder fines and tends to form thin and weak solder bonds.

FIG. 5 shows a top view of an alternative copper defined pad layout 90 for a different circuit board device than that of the pad layout 40 of FIG. 2. The pad layout 90 is configured for a device having multiple gull-winged leads. As shown in FIG. 5, the pad layout 90 includes multiple soldering pads 92(1), 92(2), . . . and a solder mask 94 that defines solder apertures 96(1), 96(2), . . . around the respective pads 92(1), 92(2), . . . (collectively, pads 92). The pads 92 are preferably arranged in rows (see the arrow 97) of uniform dimensions (e.g., 65 mils long by 13/12/10 mils wide). By way of example only, a 3 mil clearance 98 exists between each pad 92 and the solder mask 94. The connecting traces have been purposefully omitted from FIG. 5 for simplicity.

As shown in FIG. 5, each copper defined pad 92 has a periphery of substantially straight edges 100 and rounded corners 102 at the intersections of the substantially straight edges 100. In accordance with certain embodiments of the invention, each rounded corner 102 has a radius at least 8 mils. Such a rounded corner 102 is capable of being fashioned by using a protective etching mask layer (e.g., plate resist) defining a pad profile having a radius within the range of 8 mils to 12 mils and an etching process (see steps 72 and 74 of FIG. 4) since etching typically contributes approximately 3 mils of rounding and smoothening to a crisp 90 degree corner.

As further shown in FIG. 5, the manufacturer preferably prints solder paste on a central region 104 which is less than 100 percent of the top surface of each pad 92 (see step 80 of FIG. 4). By way of example only, the central region 104 covers roughly 50 percent of the pad surface and exposes the area around the pad periphery. By controlling the percent of flux and solder in the printed solder paste, the area of the central region 104 and the height of the printed solder, the manufacturer is capable of precisely controlling the positioning and the amount of solder in the solder joint that forms between each pad 92 and its corresponding component contact (see step 82 of FIG. 4).

FIG. 6 shows a top view of a copper defined pad of an alternative pad layout 110 for a different circuit board device than that of the pad layouts 40 and 90 of FIGS. 2 and 5. In particular, the pad layout 110 includes a copper defined pad 112 having a general "dog-bone" shape, and which is configured for a device having an elongated lead (e.g., a gull-wing lead, a relatively large lead for a rectifier through which a substantial amount of current flows, etc.). Multiple pads 112 can be arranged in a row (see the arrow 113) for devices having multiple leads on each side. Although the solder mask for the pad 112 is omitted in FIG. 6 for simplicity, FIG. 6 shows a suitable configuration for a connecting trace 114 (as phantom dashed lines).

As shown in FIG. 6, the pad 112 includes a main portion 116 and multiple convex lobes 118-A, 118-B, 118-C, 118-D (collectively, lobes 118) which integrate with the main portion 116. The lobes 118 encourage accumulation of solder at the corners 120 of the pad 112 and thus promote robust fillet formation in these locations for high bonding strength. Since there is greater solder volume around all portions of the pad 112 and component contact, the resulting solder joint has a stronger intermetallic at these points than that formed over conventional soldering pads.

Again, as with the other pads 42, 92 described above, the manufacturer adheres to a set of rules when forming the pad 112. In particular, the manufacturer provides a mask layer that defines curves of at least 8 mils (e.g., curves in a range between 8 mils and 12 mils) between substantially straight pad edges. As a result, the etching process provides rounded and blended curves 122 at the intersections of substantially straight pad edges 124. In particular, as shown in FIG. 6, rounded curves 122 exist between substantially straight edges 124. Each rounded curve 122 of the pad 112 thus has a radius at least 8 mils. As mentioned earlier, such rounded corners 122 are capable of being fashioned by a protective etching mask layer (e.g., plate resist) defining a pad profile having a radius within the range of 8 mils to 12 mils.

As further shown in FIG. 6, the manufacturer preferably prints solder paste on a central region 126 which is less than 100 percent of the top surface of the pad 112. By way of example only, the central region 126 covers roughly 80 percent of the pad surface and exposes the area around the pad periphery. Accordingly, there exists substantial control over flux movement during the soldering process thus reducing generation of solder fines. Further details of the invention will now be provided with reference to FIGS. 7-9.

Figure 7:
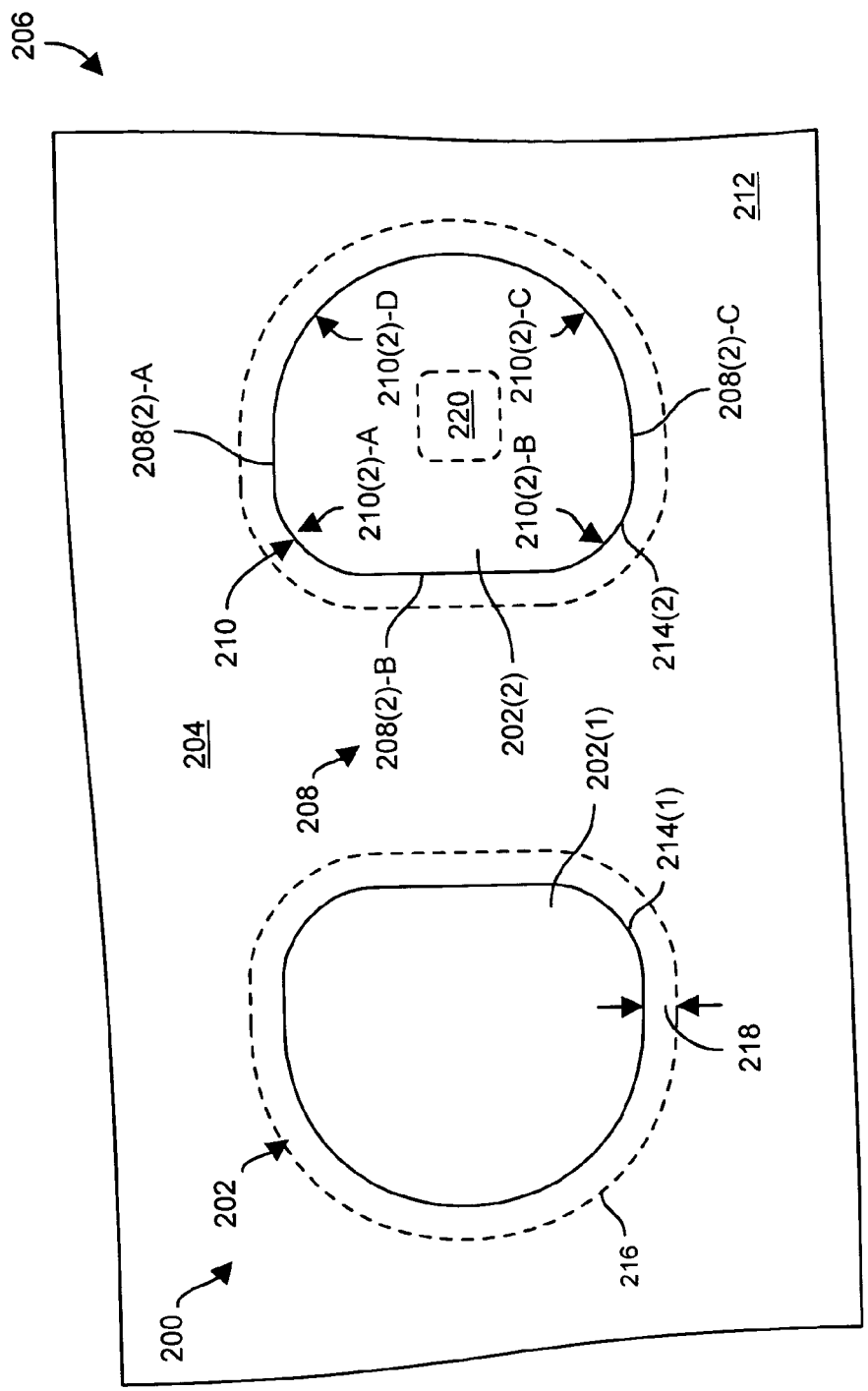
FIG. 7 shows a top view of a solder mask defined pad layout for the common circuit board device in accordance with an embodiment of the invention.

FIG. 7 shows a top view of a component mounting location 200 for a common circuit board component (e.g., an 0402 package, an 0603 package, etc.) in accordance with an embodiment of the invention. Connecting traces and the SMT component have been purposefully omitted to simply FIG. 7. As shown, the component mounting location 200 includes two SMT solder mask defined circuit board pads 202(1), 202(2) (collectively, SMT solder mask defined circuit board pads 202) which reside on a surface 204 of a portion of a circuit board 206. The SMT circuit board pads 202 have few or no sharp corners (e.g., the pads 202 have somewhat of a kidney bean shape), and are configured to solder to a standard circuit board component (e.g., a discreet diode, resistor, capacitor, etc.) using an SMT printed solder process. As with the earlier-described copper-defined pads, the lack of sharp corners on the solder mask defined pads 202 means that there are no pad extremities to (i) draw or pull solder during the soldering process that would otherwise result in significant solder movement to promote solder fines, and (ii) form weak points in the intermetallics due to low solder amounts. For example, when molten solder flows along the surfaces of the solder mask defined pads 202, the solder tends to flow in a radial manner and encounters the pad edges (i.e., the walls of the solder mask) in a smooth manner (i.e., the solder tends not splash and scatter around). Accordingly, there tends to be less inclusions and less voids in solder joints formed on the rounded pads 202, i.e., the curves of the pads 202 promote a more-homogeneous and thus stronger structure for the solder joints.

As shown in FIG. 7, each SMT solder mask defined circuit board pad 202 has at least two straight edges 208 and at least two rounded corners 210 that separate the straight edges 208. By way of example, each pad 202 has two rounded corners 210(2)-A, 210(2)-B with 8 mil radii and two opposite rounded corners 210(2)-C, 210(2)-D with 17 mil radii. The rounded corners 210(2)-C, 210(2)-D are blended together such that they essentially form a single curve (or corner) having a 17 mil radius. The rounded corner 210(2)-A separates the straight edges 208(2)-A and 208(2)-B. Similarly, the rounded corner 210(2)-B separates the straight edges 208(2)-B and 208(2)-C. Furthermore, the rounded corners 210(2)-C, 210(2)-D separate the straight edges 208(2)-A and 208(2)-C. In contrast to the earlier-described copper defined pads, a solder mask 212 on the surface 204 of the circuit board 206 defines soldering apertures 214(1), 214(2) (i.e., the outer pad peripheries) of the solder mask defined pads 202.

Figure 8:
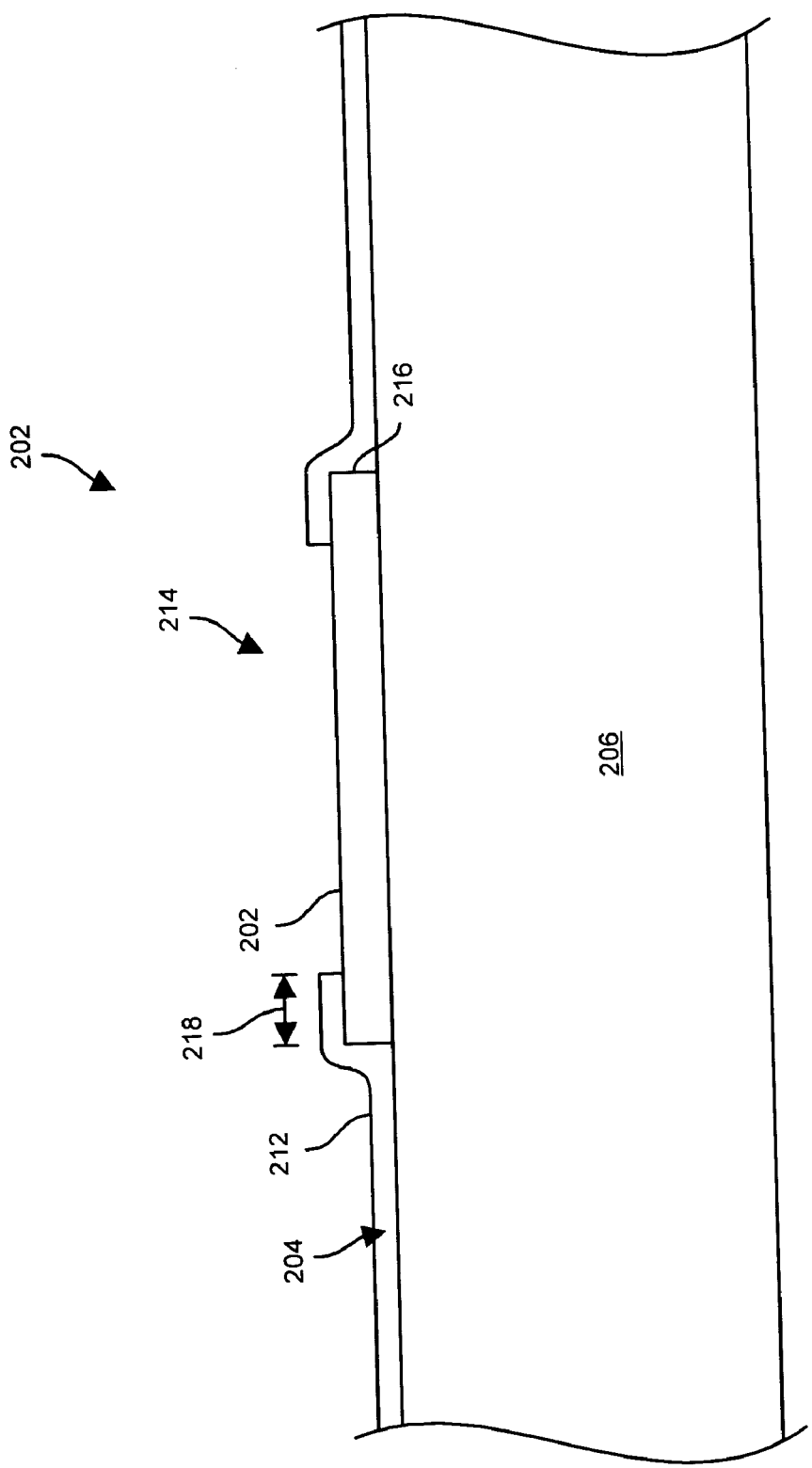
FIG. 8 shows a cross-sectional view of the solder mask defined pad layout of FIG. 7.

FIG. 8 shows a cross-sectional side view of a pad 202 of the component mounting location 200 of FIG. 7. As shown in FIG. 8, the solder mask 212 defines the exposed portion of the pad 202. That is, the solder mask 212 defines a soldering aperture 214 (also see the apertures 214(1), 214(2) of FIG. 7) which forms the shape of the pad 202. In one arrangement, copper 216 of the pad 202 is also in the shape of the soldering apertures 214(1), 214(2), i.e., the outer profile/periphery of the copper 216 (shown as dashed lines in FIG. 7) mirrors the shape of the soldering aperture 214 (again, also see the apertures 214(1), 214(2) of FIG. 7). This reduces the surface area occupied by the copper 216 thus enabling other structures (e.g., surface traces, etc.) to occupy the freed up space. Accordingly, the outer profiles of the copper 216 (FIG. 7) have radii which are larger than the radii of the soldering apertures 214(1), 214(2).

In general, the manufacturer desires at least a predetermined amount of overlap 218 (e.g., 6 mils) between the solder mask 212 and the copper pad surface 216 to ensure that the solder mask 212 adequately maintains itself structurally over the copper 216. To account for possible registration error between the solder mask 212 and the copper 216 (e.g., +/−1 mil), the manufacturer is capable of increasing the amount of overlap 218 (e.g., 8 mils) to ensure there is at least the minimum amount of overlap 218.

It should be understood that, in contrast to substantially round conventional pads (i.e., circular pads for BGA devices which do not have any straight edges), each of the solder mask defined pads 202 has at least one substantially straight edge 208 and is well-suited for soldering to non-BGA type devices. For example, the pads 202 of FIG. 2 are well-suited for discreet 0402 or 0603 packaged components, and the like. That is, the shape of the pads 202 is preferably based, at least in part, on the dimensions of the circuit board component to provide certain self-aligning features for the components in a manner similar to that provided by pads of the above-mentioned U.S. patent application Ser. No. 10/316,286. Additionally, the peripheries of pads 202 (i.e., the rounded corners and straight edges) are close to the central regions 220 (see FIG. 7) making the pads 202 essentially free of extremities that would otherwise be susceptible to low solder amounts and weak solder bond strength. Accordingly, the pads 202 do not operate as a source of solder fines, or a source of crack initiation and propagation as do conventional rectangular pads with sharp corners between straight edges.

Figure 9:
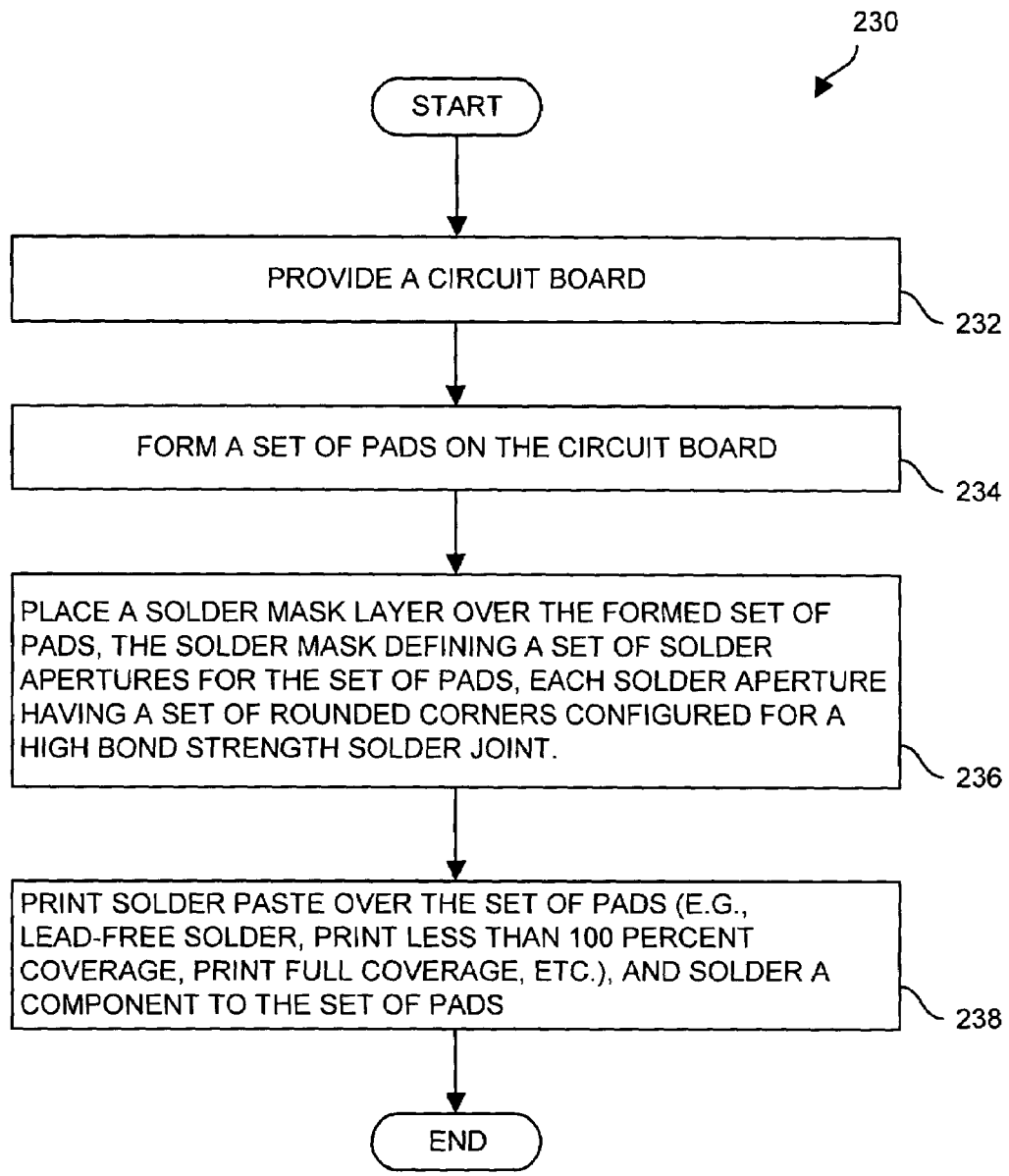
FIG. 9 shows a flowchart of a procedure for solder mask defined pads in accordance with an embodiment of the invention.

FIG. 9 shows a flowchart of a procedure 230 performed by a manufacturer using solder mask defined pads in accordance with an embodiment of the invention. In step 232, the manufacturer provides a circuit board (e.g., see the circuit board portion 206 in FIGS. 7-8).

In step 234, the manufacturer forms a set of soldering pads on the circuit board. In one arrangement, the copper edge periphery of each soldering pad mimics the shape of the eventual solder mask apertures that will expose the pad surfaces (e.g., a kidney bean shape, a dog-bone shape, etc.). In another arrangement, the copper profiles define a standard shape (e.g., rectangular, square, arbitrary, etc.).

In step 236, the manufacturer places a solder mask layer over the formed set of solder pads (e.g., see the solder mask layer 212 in FIGS. 7-8). The solder mask layer defines apertures having rounded corners configured for high bond strength solder joints. To create the solder mask layer, the manufacture lays the solder mask material over the surface of the circuit board, exposes the material to light, and develops the material. In one arrangement, the radii of the rounded corners are at least 8 mils (e.g., within a range of 8-12 mils, 17 mils, etc.).

In step 238, the manufacturer prints solder paste onto the solder mask defined pads (e.g., using a stencil), and places a component over the component mounting location formed by the pads (e.g., using pick and place equipment). The manufacturer then passes the circuit board through an oven that applies heat to activate flux within the solder paste and melt the solder. As mentioned earlier, the rounded corners 210 and lack of extremities promote a more homogenous and stronger solder joint since, as molten solder flows radially along the pad surfaces, the molten solder interfaces with the pad walls (i.e., the edges of the solder mask) in a smooth manner with little or no splashing. As a result, the solder joints formed on the rounded pads 202 tend to have less inclusions and less voids and thus have a stronger and more uniform intermetallic.

As described above, embodiments of the invention are directed to techniques for creating optimized pad geometries for a circuit board for both copper defined pads and solder mask defined pads. These techniques involve configuring the circuit board with soldering pads having rounded corners for high bond strength solder joints. Such soldering pads tend to form strong and reliable solder joints for a variety of SMT components, e.g., individual electronic element components such as individual resistors, capacitors, diodes, etc. Additionally, such soldering pads reduce or even eliminate occurrences of non-wetting pad extremities which would otherwise be sources of crack initiations and propagation. Furthermore, there is less solder movement during soldering thus reducing splattering of solder during the soldering process.

While this invention has been particularly shown and described with references to preferred embodiments thereof, it will be understood by those skilled in the art that various changes in form and details may be made therein without departing from the spirit and scope of the invention as defined by the appended claims.

For example, the particular above-described processes 70, 200 for forming copper defined pads and solder mask defined pads with rounded corners (e.g., corners with at least an 8 mil radius) were provided by way of example only. It should be understood that there are many alternate process variations used to manufacture the external copper features of a circuit board which are suitable for use by the invention. In particular, any subtractive or subtractive-additive process is capable of being enhanced in accordance with particular embodiments of the invention to provide rounded corners that inhibit solder fine production and provide high solder joint bond strength. The above-described processes 70, 200 for copper defined pads and solder mask defined pads are just a few. Other processes are suitable for use as well. In one arrangement, there is a subtractive-additive process in which, after a developed film process, a circuit board is subsequently plated with an etch mask and then etched. In another arrangement, there is an additive process in which metal forming pads with the rounded corners is built up in exposed regions that do not have a protective mask, and so on. Such modifications and enhancements are intended to belong to various embodiments of the invention.

What is claimed is:

1. A method for processing a circuit board, the method comprising:
    placing a mask layer on the circuit board, the mask layer defining a set of pad profiles for a component mounting location, each pad profile of the set of pad profiles having a set of rounded corners;
    forming, for each pad profile of the set of pad profiles, a soldering pad having a set of radii corresponding to the set of rounded corners of that pad profile to create a set of soldering pads for the component mounting location, each soldering pad having the set of radii being configured for a high bond strength solder joint;
    removing the mask layer from the circuit board;
    wherein forming, for each pad profile of the set of pad profiles, the soldering pad includes:
        etching, as the soldering pad, a surface mount contact having a main portion, and multiple convex lobes integrated with the main portion;
and
    further comprising:
        after removing the mask layer from the circuit board, printing solder paste on a top surface of each soldering pad of the set of soldering pads while leaving a periphery of the top surface of each soldering pad of the set of soldering pads exposed,
        placing a circuit board component in contact with the printed solder paste, and
        applying heat to solder the circuit board component to the set of soldering pads using the printed solder paste.

2. The method of claim 1 wherein each pad profile of the set of pad profiles has multiple rounded corners; and wherein placing the mask layer on the circuit board includes:
    configuring masking material over the circuit board, the configured masking material defining, for the multiple rounded corners of each pad profile of the set of pad profiles, curved mask edges having radii in a range between 8 mils and 12 mils.

3. The method of claim 1 wherein forming, for each pad profile of the set of pad profiles, the soldering pad having the set of radii includes:
    etching, as the soldering pad, a surface mount contact having an outer periphery in which every intersection between two substantially straight peripheral edges of the outer periphery has a radius of at least 8 mils.

4. The method of claim 1 wherein the solder paste substantially consists of flux and lead-free solder, and wherein printing the solder paste includes:
    depositing the solder paste substantially consisting of the flux and the lead-free solder over the set of soldering pads.

5. The method of claim 1 wherein placing the mask layer on the circuit board includes:
    configuring masking material over the circuit board, the configured masking material defining, for each pad profile of the set of pad profiles, a set of inward blended curves to define a trace attachment point for a circuit board pad corresponding to that pad profile, each inward blended curve having a radius in a range between 8 mils and 12 mils.

6. The method of claim 1 wherein forming, for each pad profile of the set of pad profiles, the soldering pad includes:
    etching, as the soldering pad, a surface mount contact that defines a substantially oval shape.

7. The method of claim 1 wherein forming includes:
    etching, for each pad profile of the set of pad profiles, a surface mount contact that is substantially free of angled radii sharper than 8 mils.

8. A method for processing a circuit board, the method comprising:
    providing a circuit board;
    forming a set of pads on the circuit board; and
    placing a solder mask layer over the formed set of pads, the solder mask defining a set of solder apertures for the set of pads, each solder aperture of the set of solder apertures having a set of rounded corners configured for a high bond strength solder joint;
    wherein placing the solder mask layer includes:
        creating a set of surface mount contacts, each surface mount contact having a main portion, and multiple convex lobes integrated with the main portion,
    further comprising:
        printing solder paste substantially consisting of flux and substantially lead-free solder over the set of pads; and
        soldering a component to the set of pads using the printed solder paste.

9. The method of claim 8 wherein each pad is solder mask defined and has at least one solder mask defined straight edge and at least two solder mask defined radii, and wherein placing the solder mask layer includes:
    providing solder mask material that defines, as the radii, rounded corners substantially in a range between 8 mils and 12 mils.

10. The method of claim 1 wherein the main portion of the surface mount contact is rectangular in shape; and wherein etching includes:
    providing exactly four convex lobes, each convex lobe protruding from a respective corner of the main portion which is rectangular in shape.

11. The method of claim 8 wherein the main portion of each surface mount contact is rectangular in shape; and wherein creating includes:
    providing, for each surface mount contact, exactly four convex lobes, each convex lobe protruding from a respective corner of the main portion of that surface mount contact.

12. The method of claim 1 wherein printing solder paste on the top surface of each soldering pad comprises printing solder paste on the top surface of each soldering pad of the set of soldering pads while leaving the periphery of the top surface of each soldering pad of the set of soldering pads exposed, the periphery extending about an entire perimeter defined by each soldering pad of the set of soldering pads.

13. The method of claim 1 further comprising placing a solder mask layer over each soldering pad of the set of soldering pads, the solder mask defining a set of solder apertures for the set of soldering pads, each solder aperture of the set of solder apertures having a set of rounded corners configured for a high bond strength solder joint.

14. The method of claim 10 wherein each convex lobe of the exactly four convex lobes defines a first substantially straight peripheral edge substantially parallel to a long axis of the rectangularly shaped main portion and substantially perpendicular to a short axis of the rectangularly shaped main portion, a second substantially straight peripheral edge substantially perpendicular to a long axis of the rectangularly shaped main portion and substantially parallel to a short axis of the rectangularly shaped main portion, and a curved edge disposed between the first substantially straight peripheral and the second substantially straight peripheral edge.

15. The method of claim 8 further comprising printing solder paste on a top surface of each pad of the set of pads while leaving a periphery of the top surface of each pad of the set of pads exposed, the periphery extending about an entire perimeter defined by each pad of the set of pads.

16. The method of claim 11 wherein each convex lobe of the exactly four convex lobes defines a first substantially straight peripheral edge substantially parallel to a long axis of the rectangularly shaped main portion and substantially perpendicular to a short axis of the rectangularly shaped main portion, a second substantially straight peripheral edge substantially perpendicular to a long axis of the rectangularly shaped main portion and substantially parallel to a short axis of the rectangularly shaped main portion, and a curved edge disposed between the first substantially straight peripheral and the second substantially straight peripheral edge.

17. The method of claim 1 wherein forming, for each pad profile of the set of pad profiles, the soldering pad further comprises forming the soldering pad having a first straight edge, a second straight edge opposing and substantially parallel to the first straight edge, a third straight edge substantially perpendicular to the first straight edge and to the second straight edge, a first curved edge disposed between the first straight edge and the second straight edge, a second curved edge disposed between the between the first straight edge and the third straight edge, and a third curved edge disposed between the between the second straight edge and the third straight edge.

18. The method of claim 17 wherein the first curved edge has a first radius, the second curved edge has a second radius, and the third curved edge has a third radius, the first radius being greater than the second radius, the first radius being greater than the second radius, and the second radius being substantially equal to the third radius.

19. The method of claim 8 wherein forming the set of pads on the circuit board comprises forming each pad of the set of pads as having a first straight edge, a second straight edge opposing and substantially parallel to the first straight edge, a third straight edge substantially perpendicular to the first straight edge and to the second straight edge, a first curved edge disposed between the first straight edge and the second straight edge, a second curved edge disposed between the between the first straight edge and the third straight edge, and a third curved edge disposed between the between the second straight edge and the third straight edge.

20. The method of claim 19 wherein the first curved edge has a first radius, the second curved edge has a second radius, and the third curved edge has a third radius, the first radius being greater than the second radius, the first radius being greater than the second radius, and the second radius being substantially equal to the third radius.

* * * * *